(12) United States Patent
Hanada et al.

(10) Patent No.: US 12,154,989 B2
(45) Date of Patent: Nov. 26, 2024

(54) SEMICONDUCTOR DEVICE (71) Applicant: Japan Display Inc., Tokyo (JP)

(72) Inventors: Akihiro Hanada, Tokyo (JP); Takuo Kaitoh, Tokyo (JP)

(73) Assignee: Japan Display Inc., Tokyo (JP)

( * ) Notice: Subject to any disclaimer, the term of this patent is extended or adjusted under 35 U.S.C. 154(b) by 356 days.

(21) Appl. No.: 17/523,054

(22) Filed: Nov. 10, 2021

(65) Prior Publication Data
US 2022/0173248 A1 Jun. 2, 2022

(30) Foreign Application Priority Data

Dec. 1, 2020 (JP) ................................ 2020-199568

(51) Int. Cl.
*H01L 29/786* (2006.01)

(52) U.S. Cl.
CPC .... *H01L 29/7869* (2013.01); *H01L 29/78618* (2013.01); *H01L 29/78696* (2013.01)

(58) Field of Classification Search
CPC ........... H01L 29/7869; H01L 29/78618; H01L 29/78696; H01L 29/4908; H01L 29/41733; H01L 27/1225; H10K 59/1213
See application file for complete search history.

(56) References Cited

U.S. PATENT DOCUMENTS

| 5,410,164 A | 4/1995 | Katayama et al. |
| 2006/0170067 A1 | 8/2006 | Maekawa et al. |
| 2009/0195724 A1* | 8/2009 | Park .................. H01L 29/41733 257/59 |
| 2014/0103343 A1* | 4/2014 | Jiang .................. H01L 27/1259 257/43 |

FOREIGN PATENT DOCUMENTS

JP  2012209560 A  10/2012

OTHER PUBLICATIONS

English translation of Office Action issued on Aug. 6, 2024, in corresponding Japanese Application No. 2020-199568, 6 pages.

* cited by examiner

*Primary Examiner* — Sitaramarao S Yechuri
(74) *Attorney, Agent, or Firm* — Maier & Maier, PLLC (57) ABSTRACT

A semiconductor device includes a thin-film transistor. The thin-film transistor comprises an oxide semiconductor layer, a gate insulating layer, a gate electrode overlapped on the oxide semiconductor layer through the gate insulating layer, a source electrode in contact with the oxide semiconductor layer, a drain electrode in contact with the oxide semiconductor layer and n (n is a natural number) metal layer(s) in contact with the oxide semiconductor layer and disposed across the oxide semiconductor layer between the source electrode and the drain electrode. The oxide semiconductor layer has (n+1) channel regions between the source electrode and the drain electrode in a plan view.

8 Claims, 10 Drawing Sheets

SEMICONDUCTOR DEVICE

CROSS REFERENCE TO RELATED APPLICATIONS

This application is based on and claims the benefit of priority from the prior Japanese Patent Application No. 2020-199568, filed on Dec. 1, 2020, the entire contents of which are incorporated herein by reference.

FIELD

One embodiment of the present invention relates to a semiconductor device including a thin-film transistor in each pixel. In particular, one embodiment of the present invention relates to a display device including a thin-film transistor using an oxide semiconductor.

BACKGROUND

Recently, a liquid crystal display device and an organic light-emitting diode (OLED) display device has been commonly used as a display such as a television, a mobile terminal. These display devices have a plurality of pixels in the display unit, and the control of a bright state and a dark state of each pixel is executed by the thin-film transistor. Therefore, when a defect such as a short circuit occurs in the thin-film transistor, the pixel having the thin-film transistor always becomes a bright state or a dark state, and there is a problem that the pixel does not function normally.

For such problems, the technology which makes the pixel function normally by giving redundancy to the thin-film transistor has been developed. For example, Patent Literature 1 discloses a pixel structure in which two thin-film transistors are connected in series between a source bus line and a pixel electrode. With this pixel structure, even if one of the thin-film transistors fails due to a short circuit or the like, if the other thin-film transistor operates normally, it is possible to maintain normal operation as a pixel.

SUMMARY

A semiconductor device in one embodiment of the present invention has a thin-film transistor in each pixel. The thin-film transistor comprises an oxide semiconductor layer, a gate insulating layer, a gate electrode overlapped on the oxide semiconductor layer through the gate insulating layer, a source electrode in contact with the oxide semiconductor layer, a drain electrode in contact with the oxide semiconductor layer and n (n is a natural number) metal layer(s) in contact with the oxide semiconductor layer and disposed across the oxide semiconductor layer between the source electrode and the drain electrode. The oxide semiconductor layer has (n+1) channel regions between the source electrode and the drain electrode in a plan view.

DESCRIPTION OF EMBODIMENTS

As described above, a conventional pixel structure has redundancy for each pixel by connecting a plurality of thin-film transistors which operate independently of each other in series. However, in the conventional pixel structure, since semiconductor layers of each thin-film transistor are physically separated from each other, the occupied area of the thin-film transistor at each pixel is large. Therefore, when the conventional pixel structure is adopted, an effective area of the pixel is narrowed, and there is a problem that a luminance at the time of displaying images is reduced.

One of the problems of the present invention is to improve a reliability of the semiconductor device (especially, the display device) while suppressing the occupied area of the thin-film transistor.

Embodiments of the present invention will be described below with reference to the drawings and the like. However, the present invention can be implemented in various modes without departing from the gist thereof. The present invention is not to be construed as being limited to the description of the following exemplary embodiments. For the sake of clarity of description, the drawings may be schematically represented with respect to widths, thicknesses, shapes, and the like of the respective portions in comparison with actual embodiments. The drawings, however, are to be regarded as illustrative and not restrictive of the interpretation of the invention.

In the description of the embodiment of the present invention, the direction from the substrate toward a light emitting element is defined as "above", and the opposite direction is defined as "below". However, the expression "above" or "below" merely describes the upper limit relationship of each element. For example, the expression that the light emitting element is disposed on the substrate also includes the case where other members are interposed between the substrate and the light emitting element. Furthermore, the expression "above" or "below" includes not only the case in which the elements overlap in a plan view, but also the case in which the elements do not overlap.

In the description of the embodiment of the present invention, components having the same functions as those of the elements already described are denoted by the same reference numerals or the same reference numerals, and the description thereof is omitted.

In describing embodiments of the present invention, a plurality of elements formed by applying a processing such as etching to one film may be described as elements having different functions or different roles. These elements are composed of the same layer structure and the same material. Therefore, the plurality of elements formed from one film may be referred to as elements provided in the "same layer".

In the description of embodiments of the invention, the expressions "a includes A, B or C," "a includes any of A, B and C," "a includes one selected from a group consisting of A, B and C," do not exclude the case where a includes multiple combinations of A to C unless otherwise indicated. Furthermore, these expressions do not exclude the case where a includes other elements.

In the description of the embodiments of the present invention, a "display device" refers to a device for displaying an image. That is, the "display device" includes not only a display panel or a display module, but also a device in which other optical members (e.g., polarizing members, touch panels, etc.) are attached to the display panel or the display module.

First Embodiment

[Configuration of Display Device 100]

Figure 1:
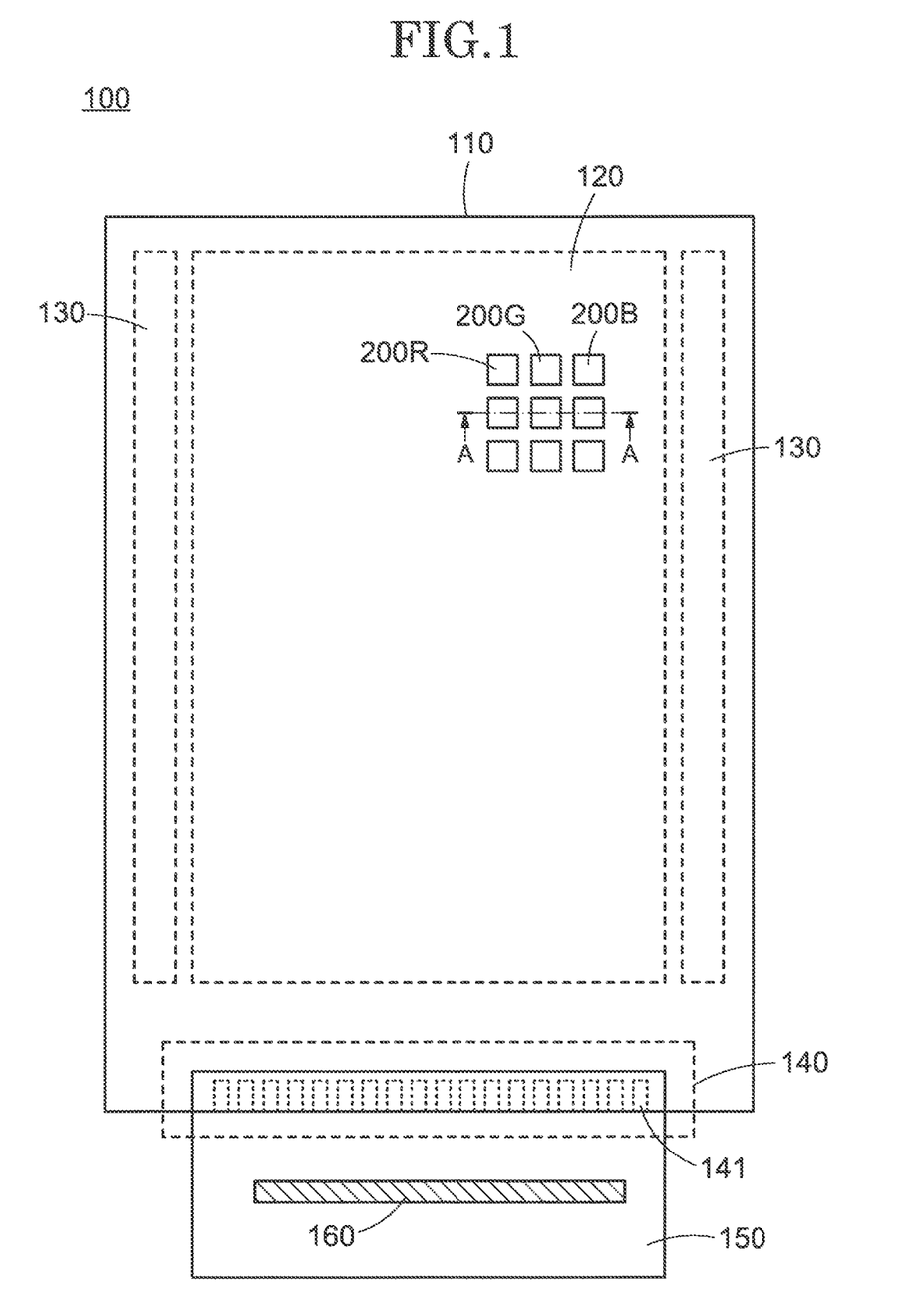
FIG. 1 is a plan view of a configuration of a display device according to a first embodiment of the present invention.

FIG. 1 is a plan view showing a configuration of a display device 100 according to a first embodiment of the present invention. The display device 100 includes a display part 120, a drive circuit part 130, and a terminal part 140. The display part 120, the drive circuit part 130, and the terminal part 140 are provided on a substrate 110.

The display part 120 has a plurality of pixels 200R, 200G and 200B. The pixel 200R corresponds to a pixel that emits in red. The pixel 200G corresponds to a pixel that emits in green. The pixel 200B corresponds to a pixel that emits in blue. The display part 120 displays images by controlling the emission and non-emission of the plurality of pixels 200R, 200G and 200B. In the present embodiment, when it is not necessary to distinguish RGB colors in particular, it may be simply described as the pixel 200. The configuration of each pixel 200 will be described later.

The drive circuit part 130 controls each pixel 200 of the display part 120. The drive circuit part 130 includes, for example, a gate line drive circuit. Although it is omitted in FIG. 1, the drive circuit part 130 may include a data line drive circuit.

The terminal part 140 functions as a terminal for receiving a signal supplied to the display part 120 and the drive circuit part 130 from the outside. The terminal part 140 includes a plurality of terminals 141. A flexible printed circuit board 150 is connected to the terminal part 140, each of the plurality of terminals 141 is connected to the corresponding terminals of the flexible printed circuit board 150 side. In the present embodiment, a driver IC chip 160 is provided on the flexible printed circuit board 150. However, the present invention is not limited to this example, and the driver IC chip 160 may be omitted.

FIG. 1 shows the overall configuration of the display device 100 in a plan view, although the substrate 110 may be bent between the display part 120 and the terminal part 140. In this case, a flexible substrate such as a resin substrate may be used as the substrate 110. With such a configuration, it is possible to fold the terminal part 140 and the flexible printed circuit board 150 on the back side of the display device 100, and the display device 100 can be miniaturized.

[Configuration of Pixel Circuit 300]

Figure 2:
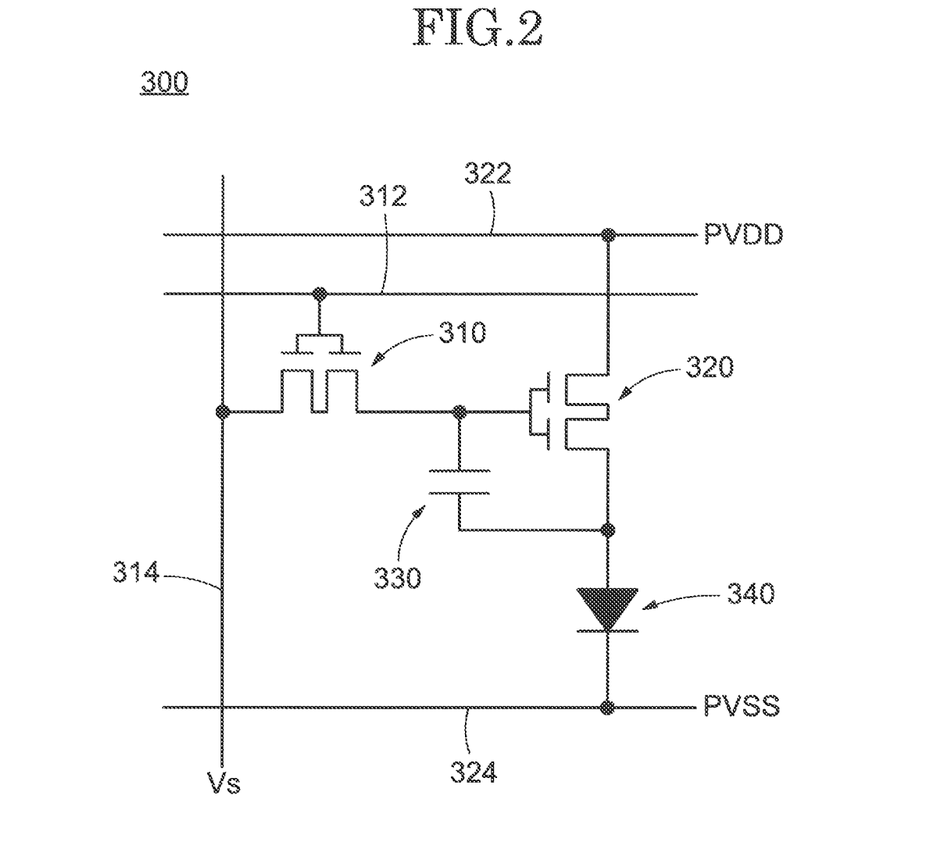
FIG. 2 is a circuit diagram of a circuit configuration of the display device according to the first embodiment of the present invention.

FIG. 2 is a circuit diagram showing a circuit configuration of a pixel 200 in the display device 100 of the first embodiment of the present invention. A pixel circuit 300 includes a selection transistor 310, a drive transistor 320, a capacitor 330, and a light emitting element 340.

The selection transistor 310 is connected to a gate line 312 and a data line 314. Specifically, the gate line 312 is connected to a gate of the selection transistor 310. The data line 314 is connected to a source of the selection transistor 310. The selection transistor 310 functions as a switch for selecting whether to input a data signal (video signal Vs) to the pixel circuit 300. A drain of the selection transistor 310 is connected to the drive transistor 320 and a gate of the capacitor 330.

The drive transistor 320 is connected to an anode power supply line 322, the light emitting element 340, and the capacitor 330. Specifically, the anode power supply line 322 is connected to a drain of the drive transistor 320. The light emitting element 340 is connected to a source of the drive transistor 320. The capacitor 330 is connected between the gate and source of the drive transistor 320. The drive transistor 320 functions as a valve for controlling the amount of current flowing through the light emitting element 340. A high-potential power supply voltage (PVDD) is applied to the anode power supply line 322.

In the present embodiment, the selection transistor 310 and the drive transistor 320 substantially have a structure in which two thin-film transistors are connected in series. The reason will be described later.

The capacitor 330 serves to hold a data signal input via the selection transistor 310. A voltage corresponding to the data signal held in the capacitor 330 is applied to the gate of the drive transistor 320. Thus, the amount of current flowing through the drive transistor 320 is controlled in accordance with the data signal.

The light emitting element 340 is connected between the drive transistor 320 and a cathode power supply line 324. Specifically, an anode of the light emitting element 340 is connected to the source of the drive transistor 320. That is, the anode of the light emitting element 340 is connected to the anode power supply line 322 via the drive transistor 320. A cathode of the light emitting element 340 is connected to the cathode power line 324. A low-potential power supply voltage (PVSS) is applied to the cathode power supply line 324.

In the pixel circuit 300, a data signal is input from the data line 314 when the selection transistor 310 is turned on. A voltage corresponding to the input data signal is held by the capacitor 330. Thereafter, during the light emission period, the gate of the drive transistor 320 is controlled by the voltage held in the capacitor 330, and a current corresponding to the data signal flows through the drive transistor 320. When a current flows through the light emitting element 340, the light emitting element 340 emits light with a luminance corresponding to the amount of current.

[Configuration of Pixel 200]

Figure 3:
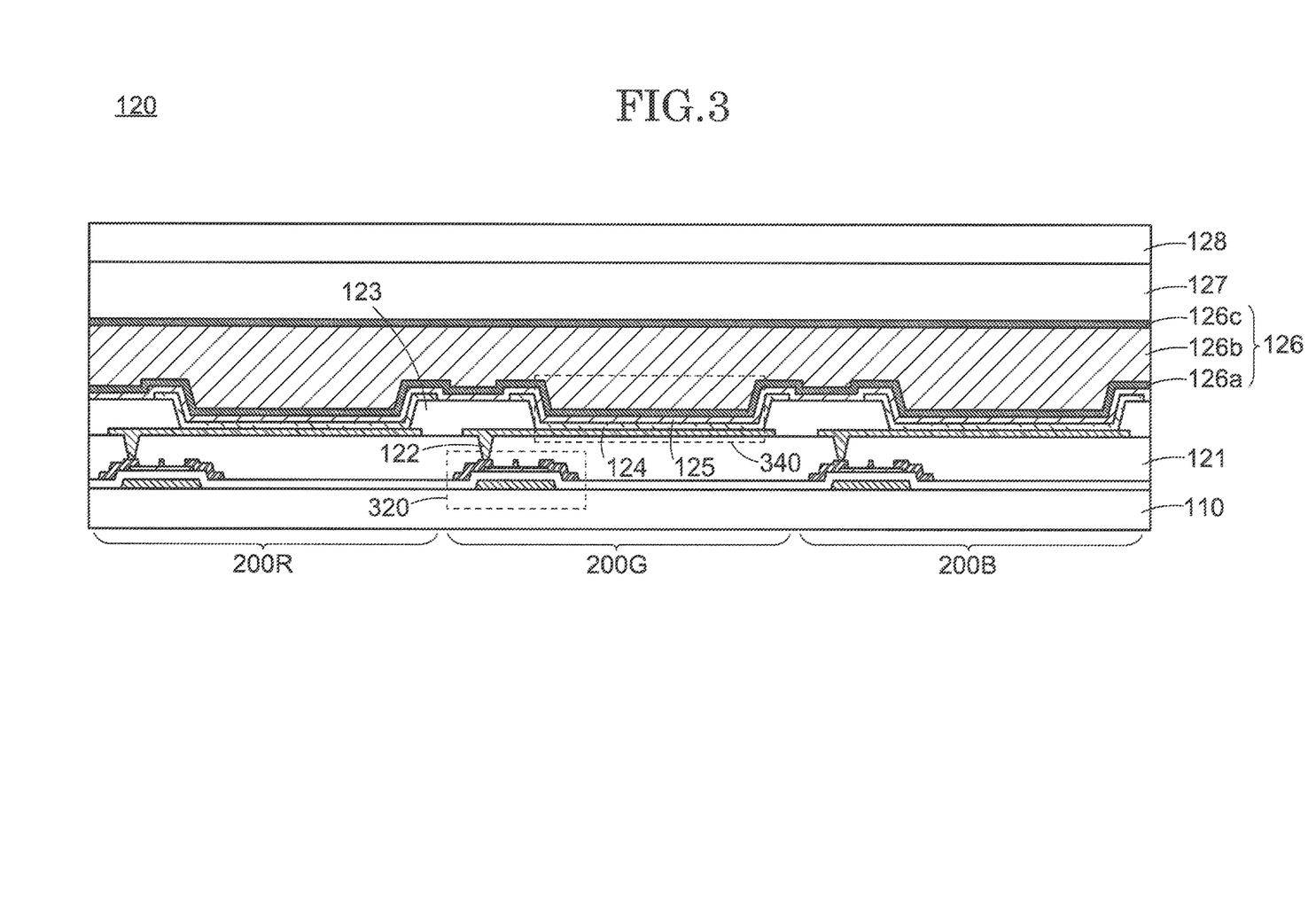
FIG. 3 is a cross-sectional view of a configuration of a display part of the display device according to the first embodiment of the present invention.

FIG. 3 is a cross-sectional view showing the configuration of the display part 120 in the display device 100 according to the first embodiment of the present invention. Specifically, the cross-sectional structure shown in FIG. 3 corresponds to a cross-sectional view of the display part 120 shown in FIG. 1 taken along the dashed-dotted line A-A. Since the basic construction of each pixel 200R, 200G and 200B is the same, FIG. 3 will focus on the pixel 200G that emits in green.

As shown in FIG. 3, the drive transistor 320 is provided on the substrate 110. Although it is omitted in FIG. 3, each element constituting the pixel circuit 300 such as the selection transistor 310 and the capacitor 330 is also provided on the substrate 110.

The drive transistor 320 is covered with an insulating layer 121 including a resin layer. A resin layer included in the insulating layer 121 has a role of planarizing the relief caused by the drive transistor 320 or the like. The insulating layer 121 may have a stacked structure of an inorganic insulating layer and the resin layer. For example, a silicon-based inorganic material such as silicon oxide or silicon nitride can be used as a material of the inorganic insulating layer. For example, a photosensitive organic material such as acrylic or polyimide can be used as a material of the resin layer.

The anode electrode 122 is provided on the insulating layer 121. The anode electrode 122 is an anode of the light emitting element 340 and also functions as a pixel electrode of the pixel 200. The anode electrode 122 is electrically connected to a source electrode of the drive transistor 320 via a contact hole provided in the insulating layer 121. In the present embodiment, the anode electrode 122 is made of a transparent conductive layer. However, not limited to this example, the anode electrode 122 may be constituted by a metal layer or may have a stacked structure of the transparent conductive layer and the metal layer. For example, a transparent conductive layer containing a metal oxide can be used as the anode electrode 122. In the present embodiment, a conductive layer formed by stacking a metal layer containing silver and a transparent conductive layer composed of ITO (Indium Tin Oxide) is used as the anode electrode 122. In this case, the conductive layer on the side in contact with an organic layer 124, which will be described later, is the transparent conductive layer.

A partition layer 123 is provided on the anode electrode 122. The partition layer 123 has an opening so that a portion of the surface of the anode electrode 122 is exposed. That is, the partition layer 123 is provided so as to cover an end of the anode electrode 122. An inner wall of the opening of the partition layer 123 is preferably a gentle tapered shape. By forming the inner wall of the opening of the partition layer 123 in a tapered shape, poor coverage of the organic layer 124 or a cathode electrode 125 formed on the anode electrode 122 can be reduced. The partition layer 123 may be referred to as a bank or a rib.

The organic layer 124 including at least a hole transport layer, a light emitting layer, and an electron transport layer is provided over the anode electrode 122. In the case of the pixel 200G, a light emitting layer of the organic layer 124 is formed of organic materials that emit green light. Similarly, in the case of the pixel 200R and the pixel 200B, the light emitting layer of the organic layer 124 is composed of an organic material that emits in red and an organic material that emits in blue, respectively. The hole transport layer and the electron transport layer included in the organic layer 124 may be provided so as to extend over each pixel 200. The organic layer 124 may further include functional layers such as an electron injection layer, an electron blocking layer, a hole injection layer, or a hole blocking layer.

The cathode electrode 125 is provided on the organic layer 124. The cathode electrode 125 may be provided so as to extend each pixel 200. In the present embodiment, the cathode electrode 125 is formed of a metal layer. However, the present invention is not limited to this example, and the cathode electrode 125 may be composed of a transparent conductive layer or may have a stacked structure of a transparent conductive layer and a metal layer. For example, a metal layer containing an alkali metal or an alkaline earth metal can be used as the cathode electrode 125. In the present embodiment, a metal layer made of an MgAg alloy (alloy containing magnesium and silver) is used as the cathode electrode 125. In this case, the thickness of the cathode electrode 125 is such that visible light can be transmitted therethrough.

A sealing layer 126 is provided on the cathode electrode 125. The sealing layer 126 has, for example, a structure in which an inorganic insulating layer 126a, an organic insulating layer 126b, and an inorganic insulating layer 126c are stacked. As a material of the inorganic insulating layer 126a and the inorganic insulating layer 126c, for example, a silicon-based inorganic material such as silicon oxide or silicon nitride can be used. The inorganic insulating layer 126a and the inorganic insulating layer 126c have a function of preventing entry of moisture from the outside. Therefore, as the inorganic insulating layer 126a and the inorganic insulating layer 126c, an insulating layer having a dense film quality is preferably used. For example, a resin material such as an acrylic resin, an epoxy resin, a polyimide resin, a silicon resin, a fluororesin, or a siloxane resin can be used as the material of the organic insulating layer 126b.

In the present embodiment, a cover glass 128 is provided on the sealing layer 126 via an adhesive layer 127. Although it is omitted in FIG. 3, an optical member such as a polarizing plate or a touch sensor may be further provided above or below the cover glass 128. The adhesive layer 127 and the cover glass 128 may be omitted.

[Configuration of Thin-Film Transistor 10]

Figure 4A:
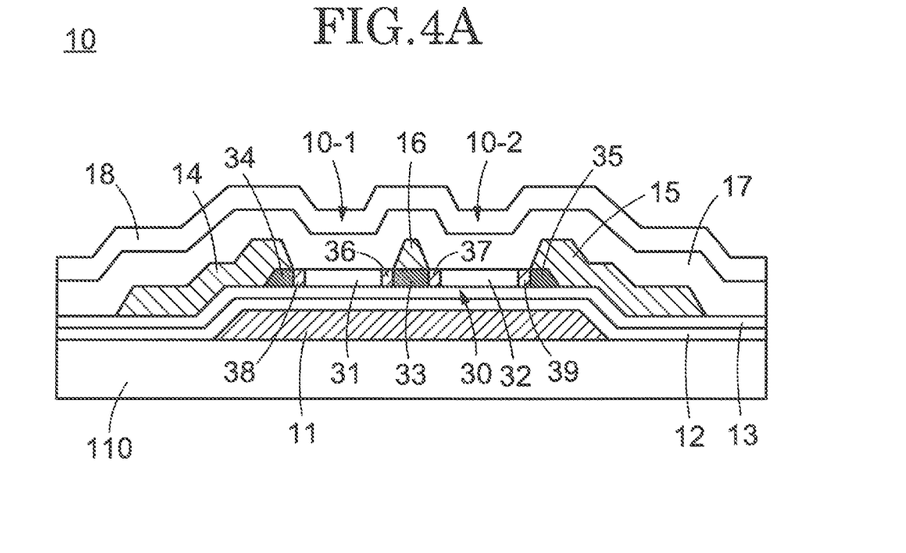
FIG. 4A is a cross-sectional view of a thin-film transistor used in the display device according to the first embodiment of the present invention.
Figure 4B:
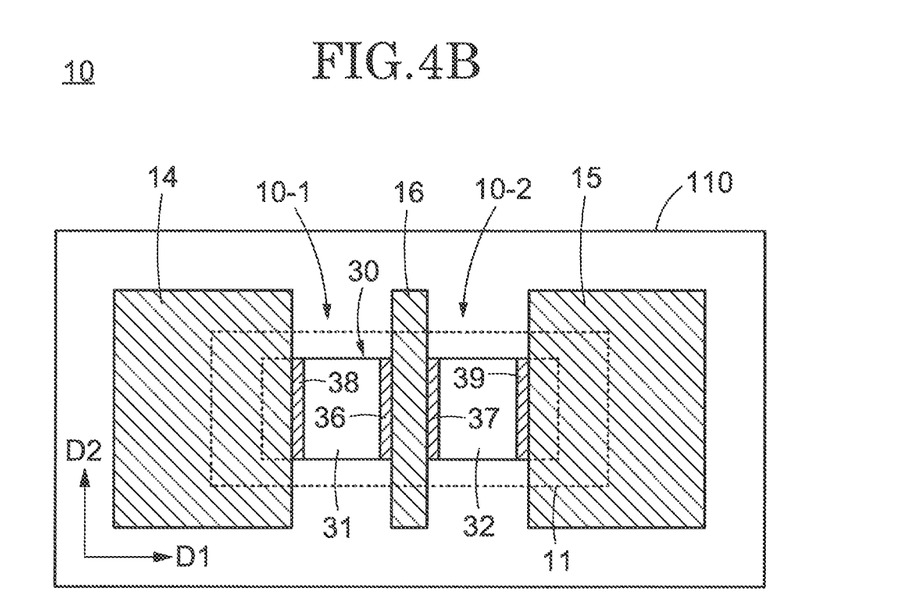
FIG. 4B is a plan view of the thin-film transistor used in the display device according to the first embodiment of the present invention.

FIG. 4A is a cross-sectional view showing a configuration of a thin-film transistor 10 used in the display device 100 according to the first embodiment. FIG. 4B is a plan view showing a configuration of the thin-film transistor 10 used in the display device 100 according to the first embodiment of the present invention. In FIG. 4B, insulating layers 17 and 18 shown in FIG. 4A are omitted for convenience of explanation. The thin-film transistor 10 may be used for at least one of the selection transistor 310 and the drive transistor 320 shown in FIG. 2. The thin-film transistor 10 shown in FIG. 4A and FIG. 4B is an example of a bottom-gate transistor.

A gate electrode 11 is provided on the substrate 110 having an insulating surface. For example, a light-transmitting substrate made of glass, quartz, sapphire, or the like can be used as the substrate 110. However, a non-light-transmitting substrate made of silicon, ceramics, or the like may be used as the substrate 110. Further, a flexible substrate made of a resin material such as a polyimide resin, an acrylic resin, a siloxane resin or a fluororesin may be used as the substrate 110.

The gate electrode 11 is made of, for example, a metal material such as titanium, tantalum, tungsten, molybdenum, vanadium, aluminum, copper, or niobium, or an alloy material containing any of these metals. The gate electrode 11 may have a single layer structure or a stacked structure.

The gate electrode 11 is covered with insulating layers 12 and 13. In the present embodiment, the insulating layer 12 is a silicon nitride layer. The insulating layer 13 is a silicon oxide layer. In the present embodiment, the insulating layers 12 and 13 are stacked to function as a gate insulating layer. However, not limited to this example, the insulating layer 13 may be used as a single layer as the gate insulating layer.

An oxide semiconductor layer 30 is provided above the insulating layer 13. For example, indium gallium zinc oxide (IGZO), indium tin oxide (ITZO), indium aluminum zinc oxide (IAZO), or Zinc Oxide (ZnO) and the like can be used as a material of the oxide semiconductor layer 30. The oxide semiconductor layer 30 may be a single layer or a stacked layer. In the present embodiment, indium gallium zinc oxide (IGZO) is used as the oxide semiconductor layer 30. Therefore, the thin-film transistor 10 of the present embodiment operates as an N-channel transistor having a majority carrier as an electronic. Details of a structure of the oxide semiconductor layer 30 will be described later.

On the oxide semiconductor layer 30, a source electrode 14 and a drain electrode 15 are provided so as to contact the end of the oxide semiconductor layer 30. Specifically, in cross-sectional view, the source electrode 14 is provided so as to contact a first end portion of the oxide semiconductor layer 30, and the drain electrode 15 is provided so as to contact a second end portion on the opposite side of the first end portion. In the present embodiment, the source electrode 14 and the drain electrode 15 are provided so as to cover three sides at the end portion of the oxide semiconductor layer 30, but the present invention is not limited to this example. For example, the source electrode 14 and the drain electrode 15 may be provided so as to cross the oxide semiconductor layer 30, (that is, so as to cover two sides).

The source electrode 14 and the drain electrode 15 are made of a metal material such as titanium, aluminum, tantalum, tungsten, molybdenum, vanadium, aluminum, copper, or niobium, or an alloy material containing any of these metals. The source electrode 14 and the drain electrode 15 may have a single layer structure or a stacked structure. In the present embodiment, a metal layer having a three-layer structure of titanium/aluminum/titanium is used as the source electrode 14 and the drain electrode 15.

In the present embodiment, a metal layer 16 is formed at the same time as the source electrode 14 and the drain electrode 15. That is, the metal layer 16 is provided in the same layer as the source electrode 14 and the drain electrode 15. Therefore, the metal layer 16 in the present embodiment has a three-layer structure of titanium/aluminum/titanium similar to the source electrode 14 and the drain electrode 15. That is, the metal layer 16 has a configuration in which the bottom titanium layer is in contact with the oxide semiconductor layer 30. However, the present invention is not limited to this example, and the metal layer 16 may be formed of a metal material different from the source electrode 14 and the drain electrode 15. As will be described later, in order to prevent hydrogen from migrating inside the oxide semiconductor layer 30, it is preferable to use a metal material that easily absorbs hydrogen, such as titanium or molybdenum, as the material of the metal layer 16.

The metal layer 16 is in contact with the oxide semiconductor layer 30 and is disposed apart from the source electrode 14 and the drain electrode 15. Specifically, in the present embodiment, the metal layer 16 is disposed so as to be separated from the source electrode 14 and the drain electrode 15 by a distance substantially equal to each other. However, not limited to this example, the metal layer 16 may be closer to either the source electrode 14 or the drain electrode 15.

As shown in FIG. 4B, the metal layer 16 is disposed so as to cross the oxide semiconductor layer 30. Here, assuming that the longitudinal direction of the oxide semiconductor layer 30 (the direction connecting the source electrode 14 and the drain electrode 15) is the D1 direction, the metal layer 16 has a longitudinal direction in the D2 direction that crosses the D1 direction. That is, the metal layer 16 is disposed so as to cross the oxide semiconductor layer 30 along the D2 direction.

In the present embodiment, the metal layer 16 is electrically floating. That is, the potential of the metal layer 16 is not fixed. However, the present invention is not limited to this example, and the metal layer 16 may be fixed to a constant potential. A width of the metal layer 16 is not particularly limited. In the present embodiment, the width of the metal layer 16 is 1.0 μm or more and 3.0 μm or less. However, the lower limit of the width of the metal layer 16 may be the minimum width that can be exposed.

As shown in FIG. 4A, the insulating layers 17 and 18 are provided on the source electrode 14, the drain electrode 15, and the metal layer 16. The insulating layers 17 and 18 function as a passivation layer, respectively. In the present embodiment, a silicon oxide layer is used as the insulating layer 17. Further, a silicon nitride layer is used as the insulating layer 18. In addition to serving as the passivation layer, the insulating layer 17 serves to supply oxygen to the oxide semiconductor layer 30. Therefore, It is preferable to use a material having a relatively large oxygen content, such as silicon oxide or silicon oxynitride as the material of the insulating layer 17. In contrast, the insulating layer 18 mainly serves as the passivation layer. Therefore, it is preferable to use a silicon nitride layer having a dense film quality as the insulating layer 18.

<Configuration of Oxide Semiconductor Layer 30>

In the thin-film transistor 10 of the present embodiment, the oxide semiconductor layer 30 is divided into a plurality of channel regions by the metal layer 16. Specifically, the oxide semiconductor layer 30 of the present embodiment is divided into two channel regions (a channel region 31 and a channel region 32) by one metal layer 16. An isolating region 33 is provided between the channel region 31 and the channel region 32. The isolating region 33 corresponds to a region in contact with the metal layer 16. That is, the isolating region 33 is disposed so as to cross the oxide semiconductor layer 30 along the D2 direction shown in FIG. 4B. Therefore, the channel region 31 and the channel region 32 are separated from each other by the isolating region 33.

Since the oxide semiconductor layer 30 of the present embodiment is indium gallium zinc oxide (IGZO), it has a physical property that when oxygen is desorbed from the inside of the layer to the outside, the electric resistance of the portion is reduced. Therefore, when another metal layer comes into contact with the oxide semiconductor layer 30, a phenomenon occurs in which oxygen is desorbed from the inside of the oxide semiconductor layer 30 as the other metal layer is oxidized. That is, the oxide semiconductor layer 30 of this embodiment has a physical property that the electric resistance of the portion in contact with another metal layer and a vicinity thereof is lowered. Therefore, a plurality of regions having a lower electrical resistance than the channel regions 31 and 32 are formed in the oxide semiconductor layer 30 of this embodiment by the influence of the source electrode 14, the drain electrode 15, and the metal layer 16.

Specifically, as shown in FIG. 4A, a source region 34 and a drain region 35 are formed respectively in regions of the oxide semiconductor layer 30 that are in contact with the source electrode 14 and the drain electrode 15. The isolating region 33 described above is formed in a region in contact with the metal layer 16. In this case, each of the isolating region 33, the source region 34, and the drain region 35 has substantially the same electrical resistance (electrical conductivity).

In addition, low-resistance regions 36 to 39 are formed respectively in regions of the oxide semiconductor layers 30 that are adjacent to the isolating region 33, the source region 34, and the drain region 35. The low resistance regions 36 to 39 are regions in which oxygen is desorbed by the influence of the source electrode 14, the drain electrode 15, and the metal layer 16. Each of the low resistance regions 36 to 39 has lower electrical resistances than the channel regions 31 and 32 and has higher electrical resistances than the isolating region 33, the source region 34, and the drain region 35. The low resistance regions 36 to 39 serve as buffer regions to mitigate electric field concentration in a vicinity of the drain region 35. Such a buffer region is effective as a hot carrier countermeasure.

As described above, the isolating region 33, the source region 34, the drain region 35, and the low resistance regions 36 to 39 are formed by desorption of oxygen from the inside of the oxide semiconductor layer 30. Therefore, the oxygen concentration of these regions is lower than that of the oxygen concentration of the channel regions 31 and 32. The oxygen concentration of the low resistance regions 36 to 39 is higher than that of the isolating region 33, the source region 34, and the drain region 35, and lower than that of the channel regions 31 and 32.

As described above, the thin-film transistor 10 of the present embodiment has the two channel regions 31 and 32 within one oxide semiconductor layer 30. Here, the gate electrode 11 overlaps on both the channel regions 31 and 32 via the insulating layers 12 and 13. Therefore, the thin-film transistor 10 of the present embodiment substantially has a structure in which two thin-film transistors are connected in series. In this case, the isolating region 33 serves as a drain region of a thin-film transistor 10-1 and serves as a source region of a thin-film transistor 10-2.

Since the thin-film transistor 10 of the present embodiment has a structure in which the thin-film transistor 10-1 and the thin-film transistor 10-2 are connected in series, even if a defect such as a short circuit occurs in one of the thin-film transistors, if the other thin-film transistor operates normally, the function as a switching element can be maintained as a whole. That is, in the thin film transistor 10 of the present embodiment, at least one of the thin film transistor 10-1 and the thin film transistor 10-2 may operate normally. Thus, the thin-film transistor 10 has redundancy.

The cause of a defect in the operation of the thin-film transistor 10-1 or 10-2 is that, for example, an operation of the thin-film transistor 10-1 or 10-2 is changed to a depletion type operation due to the influence of hydrogen mixed in the channel region 31 or 32. That is, by hydrogen is mixed into the channel region 31 or 32, there is a case where the thin-film transistor 10-1 or 10-2 is always on state.

Hydrogen contamination as described above may occur, for example, when impurities containing hydrogen adhere to or mix with the channel region 31 or 32. The impurities may be, for example, the insulating layer 12, the insulating layer 13, and particles or the like due to the formation of the insulating layer 17 or the insulating layer 18. Hydrogen is contained in a raw material gas at the time of forming these insulating layers (silicon oxide layer or silicon nitride layer). Therefore, when particles caused by these insulating layers adhere to or mix with the channel region 31 or 32, the particles become a source of hydrogen.

However, in the present embodiment, even if the channel region 32 of the thin-film transistor 10-2 is depressed by the influence of hydrogen, the diffusion of hydrogen stops at the isolating region 33, so that the adjacent channel region 31 is not affected. In other words, the isolation region 33 functions as a barrier against hydrogen migration between the channel region 31 and the channel region 32. Further, since a metal material capable of absorbing hydrogen such as titanium or molybdenum is used as a material of the metal layer 16, the metal layer 16 also functions as a barrier preventing the migration of hydrogen.

Thus, the thin-film transistors 10-1 and 10-2 can operate in a mutually complementary manner and provide redundancy in the operation of the thin-film transistor 10. Further, according to the present embodiment, since it is not necessary to physically separate the oxide semiconductor layer 30 and only providing the metal layer 16 is needed, it is possible to reduce the size of the thin-film transistor 10. Thus, according to the present embodiment, it is possible to improve the reliability of the display device 100 while suppressing the occupied region of the thin-film transistor 10.

<Method of Manufacturing Thin-Film Transistor 10>

FIG. 5A, FIG. 6A, FIG. 7A, FIG. 8A, and FIG. 9A are cross-sectional views showing methods of manufacturing the thin-film transistor 10 used in the display device 100 according to the first embodiment. FIG. 5B, FIG. 6B, FIG. 7B, FIG. 8B and FIG. 9B are plan views showing the method of manufacturing the thin-film transistor 10 used in the display device 100 according to the first embodiment.

Figure 5A:
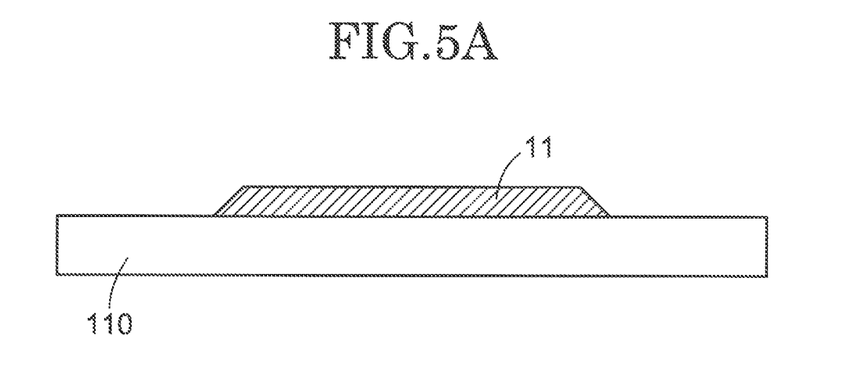
FIG. 5A is a cross-sectional view of a manufacturing process of the thin-film transistor used in the display device according to the first embodiment of the present invention.
Figure 5B:
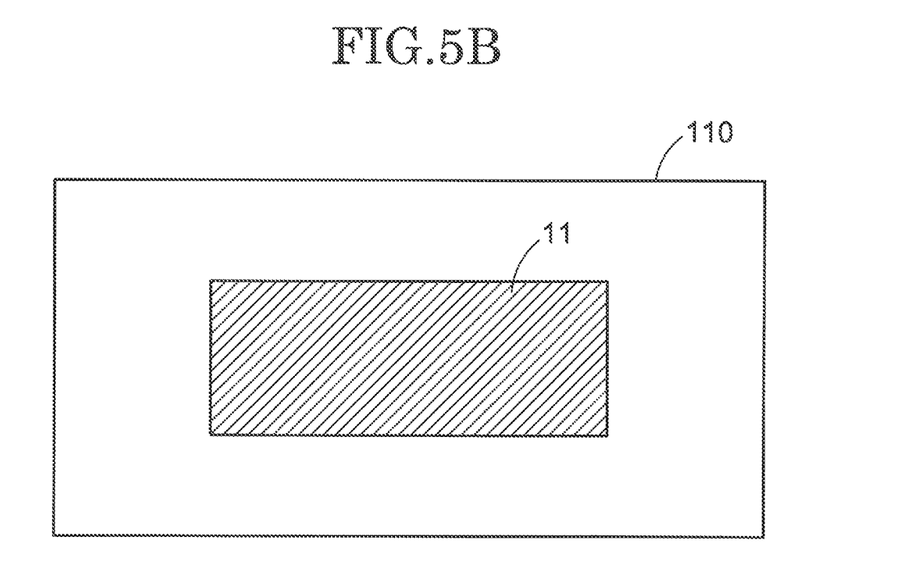
FIG. 5B is a plan view of a manufacturing process of the thin-film transistor used in the display device according to the first embodiment of the present invention.

First, as shown in FIG. 5A and FIG. 5B, the gate electrode 11 is formed on the substrate 110. Specifically, a metal layer containing a metal material forming the gate electrode 11 (which is aluminum and titanium as the metal material in the present embodiment) is formed. Thereafter, the gate electrode 11 is formed by performing an etching process on the metal layer that aluminum and titanium are stacked.

Figure 6A:
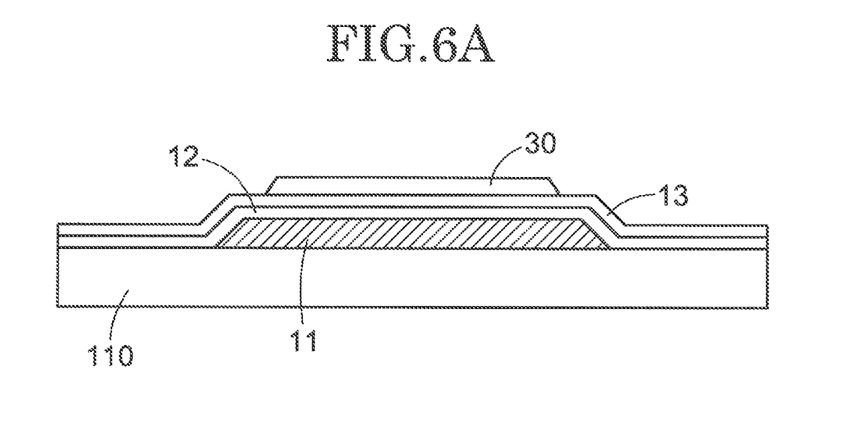
FIG. 6A is a cross-sectional view of a manufacturing process of the thin-film transistor used in the display device according to the first embodiment of the present invention.
Figure 6B:
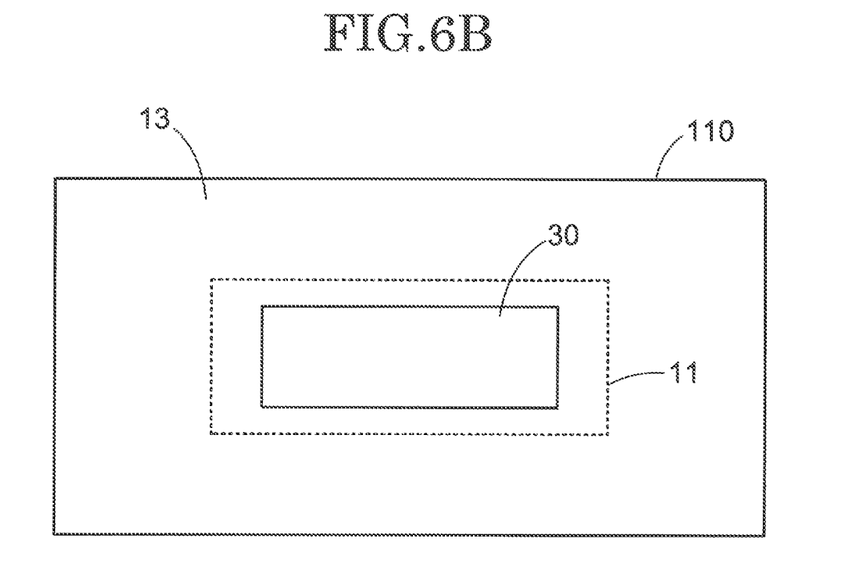
FIG. 6B is a plan view of a manufacturing process of the thin-film transistor used in the display device according to the first embodiment of the present invention.

Next, as shown in FIG. 6A and FIG. 6B, the insulating layers 12 and 13 are formed so as to cover the gate electrode 11. In this embodiment, first, a silicon nitride layer is formed as the insulating layer 12. Thereafter, a silicon oxide layer is formed as an insulating layer 13 on the insulating layer 12. After forming the insulating layer 13, the oxide semiconductor layer 30 is formed on the insulating layer 13. In this embodiment, first, an oxide semiconductor layer composed of indium gallium zinc oxide (IGZO) is formed with a thickness of 40 nm or more and 100 nm or less. Thereafter, the oxide semiconductor layer 30 is formed by performing an etching process on the oxide semiconductor layer.

Figure 7A:
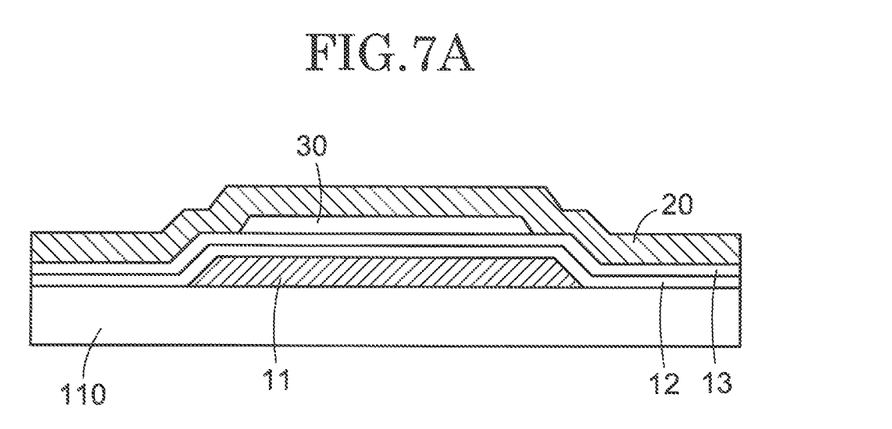
FIG. 7A is a cross-sectional view of a manufacturing process of the thin-film transistor used in the display device according to the first embodiment of the present invention.
Figure 7B:
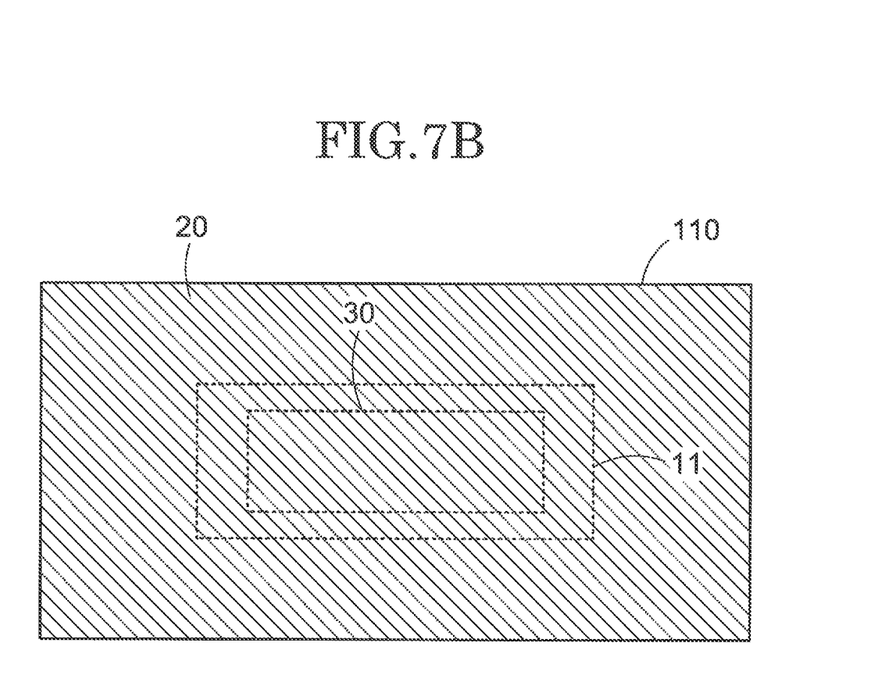
FIG. 7B is a plan view of a manufacturing process of the thin-film transistor used in the display device according to the first embodiment of the present invention.

Next, as shown in FIG. 7A and FIG. 7B, a metal layer 20 is formed so as to cover the oxide semiconductor layer 30. The metal layer 20 is formed by stacking a titanium layer, an aluminum layer, and a titanium layer in this order from the lower layer. In the present embodiment, the oxide semiconductor layer 30 and the aluminum layer are not in direct contact with each other by providing the titanium layer in the bottom layer. Thus, it is possible to prevent excessive oxygen desorption from the oxide semiconductor layer 30 due to oxidation of the aluminum layer. Further, as described above, by the titanium layer is adjacent to the oxide semiconductor layer 30, it is possible to prevent hydrogen from migrating between adjacent channel regions.

Figure 8A:
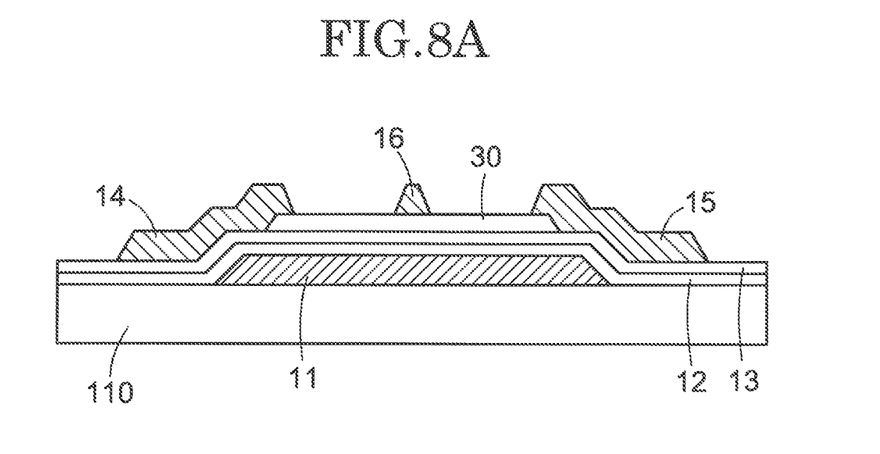
FIG. 8A is a cross-sectional view of a manufacturing process of the thin-film transistor used in the display device according to the first embodiment of the present invention.
Figure 8B:
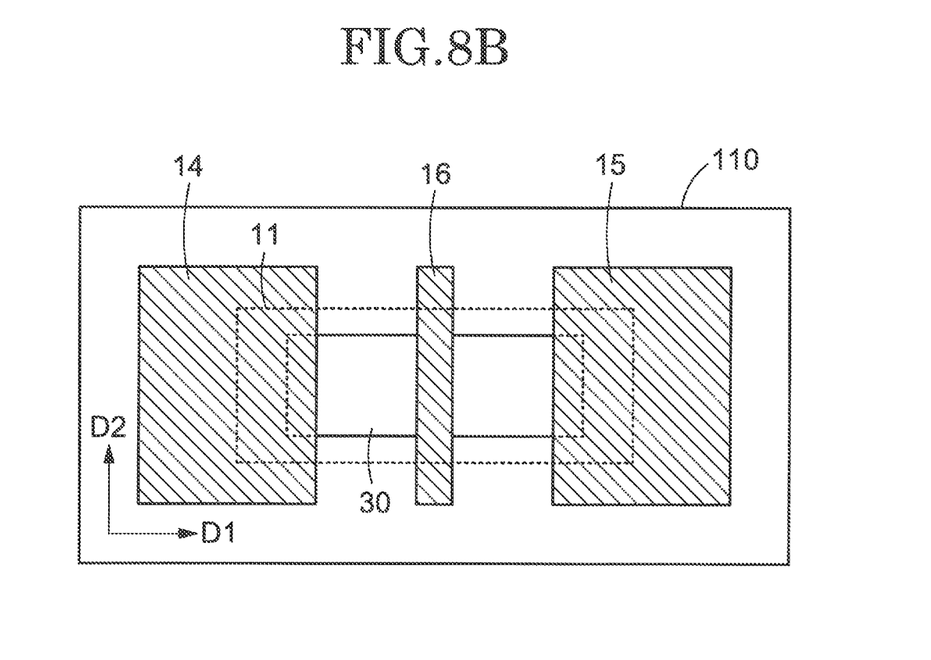
FIG. 8B is a plan view of a manufacturing process of the thin-film transistor used in the display device according to the first embodiment of the present invention.

Next, as shown in FIG. 8A and FIG. 8B, the source electrode 14, the drain electrode 15, and the metal layer 16 are formed by etching to the metal layer 20. At this time, as shown in FIG. 8B, the metal layer 16 is formed so as to cross the oxide semiconductor layer 30 in the D2 direction. In the present embodiment, the metal layer 16 is formed so that the distances from the source electrode 14 and the drain electrode 15 are the same or substantially the same. Thus, the source electrode 14, the drain electrode 15, and the metal layer 16 are simultaneously formed in the same process. That is, the source electrode 14, the drain electrode 15, and the metal layer 16 are elements provided in the same layer. However, the present invention is not limited to this example, and the metal layer 16 may be formed of a metal material different from the source electrode 14 and the drain electrode 15.

Figure 9A:
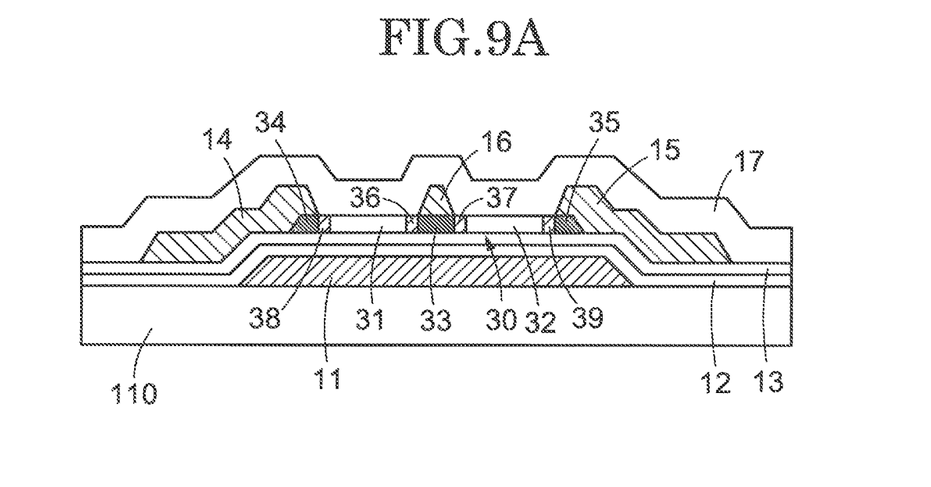
FIG. 9A is a cross-sectional view of a manufacturing process of the thin-film transistor used in the display device according to the first embodiment of the present invention.
Figure 9B:
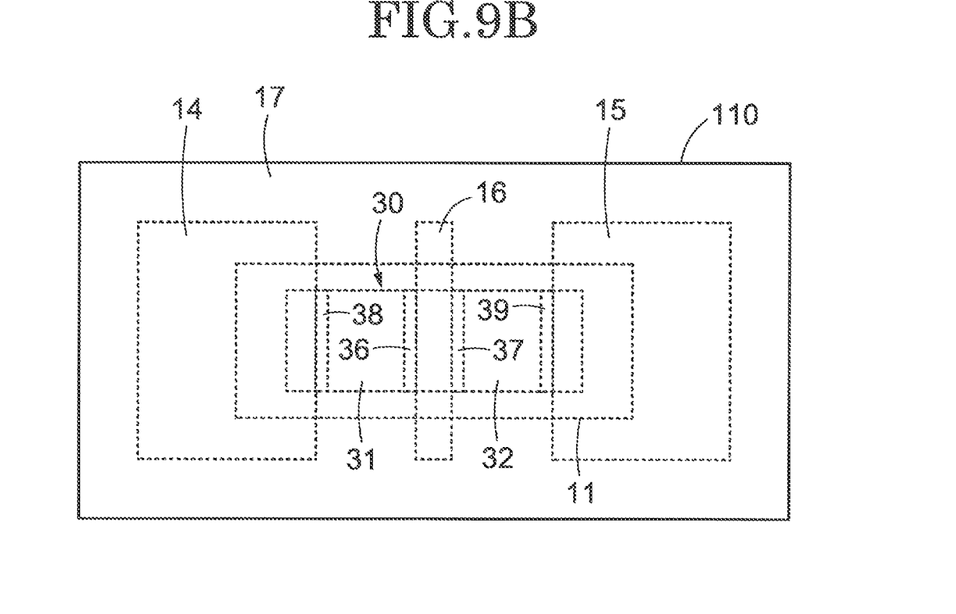
FIG. 9B is a plan view of a manufacturing process of the thin-film transistor used in the display device according to the first embodiment of the present invention.

Next, as shown in FIG. 9A and FIG. 9B, the insulating layer 17 is formed so as to cover the source electrode 14, the drain electrode 15, the metal layer 16, and the oxide semiconductor layer 30. In the present embodiment, a silicon oxide layer is formed with a thickness of 100 nm or more and 300 nm or less as the insulating layer 17. In the present embodiment, the channel regions 31 and 32, the isolating region 33, the source region 34, the drain region 35, and the low resistance regions 36 to 39 are formed in the oxide semiconductor layer 30 during the formation process of the insulating layer 17. After forming the insulating layer 17, a baking process may be performed to the insulating layer 17.

In the forming process and the baking process of the insulating layer 17 described above, oxygen is supplied to the channel regions 31 and 32 from the silicon oxide layer which is the insulating layer 17. Thus, the electrical resistance of the channel regions 31 and 32 can be adjusted so that the channel regions 31 and 32 function normally as channels. The oxygen desorbed from the insulating layer 17 is also supplied to the isolating region 33 and the low resistance regions 36 to 39. However, oxygen is desorbed from the isolating region 33 and the low resistance regions 36 to 39 by the influence of the metal layer 16. Thus, the electrical resistance of the isolating region 33 and the low resistance regions 36 to 39 is lower than that of the channel regions 31 and 32.

Upon completion of FIG. 9A and FIG. 9B processing, the insulating layer 18 is formed over the insulating layer 17. In this embodiment, a silicon nitride layer is formed with a thickness of 100 nm or more and 200 nm or less as the insulating layer 18. Thus, the thin-film transistor 10 of the construction described with reference to the FIG. 4A and FIG. 4B is completed.

<Modification 1>

In the present embodiment, a metal material such as titanium, tantalum, tungsten, molybdenum, vanadium, or niobium, or an alloy material containing any of these metals is exemplified as a material of the metal layer 16. However, in order to further enhance the effect of preventing the transfer of hydrogen, an alkali metal or an alkaline earth metal may be included as a material of the metal layer 16. For example, a metallic material such as magnesium, calcium, or lanthanum, or an alloy material containing these metals may be used. In this case, for example, a stacked structure in which a metal layer containing an alkali metal or an alkaline earth metal is sandwiched between a metal layer such as more stable titanium or molybdenum may be used.

Second Embodiment

Figure 10A:
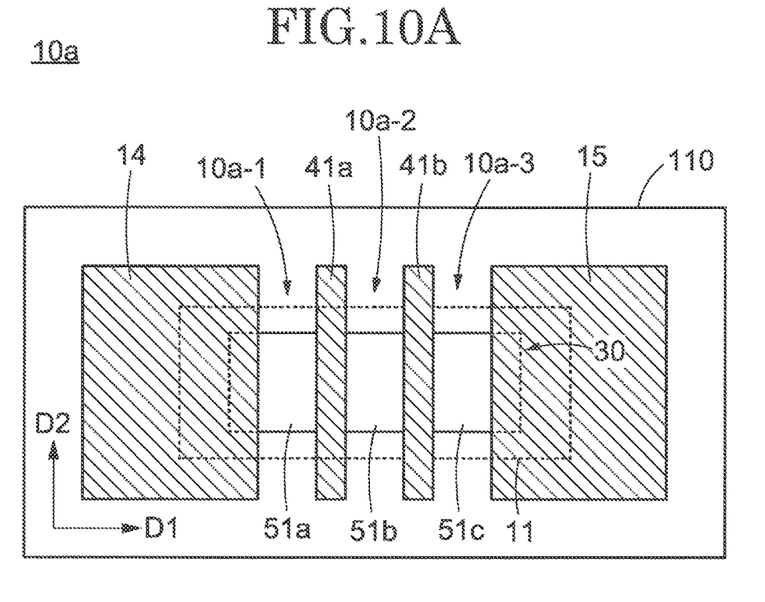
FIG. 10A is a cross-sectional view of a thin-film transistor used in a display device according to a second embodiment of the present invention.
Figure 10B:
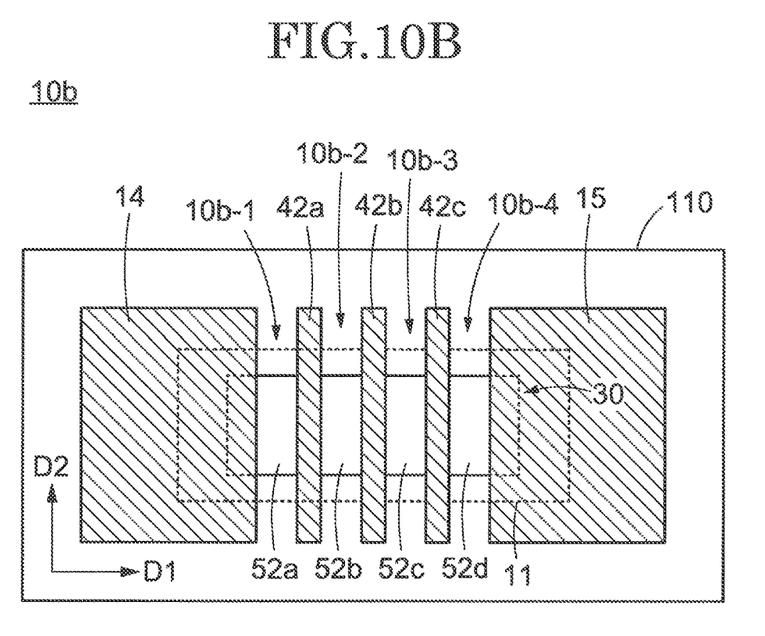
FIG. 10B is a plan view of the thin-film transistor used in the display device according to the second embodiment of the present invention.

In the present embodiment, a display device provided with thin-film transistors 10a and 10b having a structure different from that of the first embodiment will be described. Specifically, the thin-film transistors 10a and 10b of the present embodiment have a plurality of metal layers in contact with the oxide semiconductor layer 30 between the source electrode and the drain electrode. In the present embodiment, portions different from those of the first embodiment will be mainly described. In the drawings used in the description of the present embodiment, the same components as those of the first embodiment are denoted by the same reference numerals, and detailed description thereof is omitted.

FIG. 10A is a plan view showing the configuration of the thin-film transistor 10a used in the display device of the second embodiment of the present invention. FIG. 10B is a plan view showing the configuration of the thin-film transistor 10b used in the display device of the second embodiment of the present invention. In the present embodiment, for convenience of description, the drawing of the low resistance region described in the first embodiment is omitted.

The thin-film transistor 10a shown in FIG. 10A has two metal layers 41a and 41b between the source electrode 14 and the drain electrode 15. Since the materials of the metal layers 41a and 41b are the same as those of the first embodiment, the description thereof is omitted here. By disposing the two metal layers 41a and 41b, three channel regions 51a, 51b, and 51c are formed in the oxide semiconductor layer 30. That is, the thin-film transistor 10a has a structure in which substantially three thin-film transistors 10a-1, 10a-2 and 10a-3 are connected in series. In this case, the thin-film transistor 10a can maintain the function as a switching element if at least one of the three thin-film transistors 10a-1, 10a-2, and 10a-3 operate normally.

The thin-film transistor 10b shown in FIG. 10B has three metal layers 42a, 42b, and 42c between the source electrode 14 and the drain electrode 15. Since the materials of the metal layers 42a, 42b, and 42c are the same as those of the first embodiment, their descriptions are omitted here. By disposing the three metal layers 42a, 42b, and 42c, four channel regions 52a, 52b, 52c, and 52d are formed in the oxide semiconductor layer 30. That is, the thin-film transistor 10b has a structure in which four thin-film transistors 10b-1, 10b-2, 10b-3, and 10b-4 are connected in series. In this case, the thin-film transistor 10b is possible to maintain the function as a switching element, if at least one of the four thin-film transistors 10b-1, 10b-2, 10b-3, and 10b-4 operates normally.

As described above, by increasing the number of metal layers disposed on top of the oxide semiconductor layer 30, also increases the number of channel regions by that amount. Specifically, by arranging n (n is a natural number) metal layers on the oxide semiconductor layer 30, in a plan view, (n+1) channel regions can be provided between the source region and the drain region. Thus, according to the present embodiment, by increasing the number of metal layers, it is possible to improve the redundancy of the thin-film transistor. As a result, it is possible to improve the reliability of the display device having a highly redundant thin-film transistor as a switching element in each pixel.

In each of the embodiments described above, the display device has been exemplified and described. However, not limited to this example, each embodiment can be applied to the overall device including a device using a semiconductor, i.e., a semiconductor device. In addition, each of the embodiments described above as an embodiment of the present invention can be appropriately combined and implemented as long as they do not contradict each other. Those skilled in the art that add, delete, or change the design of constituent elements, or add, omit, or change the conditions of processes are also included in the scope of the present invention as long as they have the gist of the present invention.

Further, it is understood that other operational effects different from those provided by the aspects of the respective embodiments described above, or those which can be easily predicted by those skilled in the art from the description herein, are naturally brought about by the present invention.

What is claimed is:

1. A semiconductor device comprising a thin-film transistor, the thin-film transistor comprising:
    an oxide semiconductor layer;
    a gate insulating layer;
    a gate electrode overlapped on the oxide semiconductor layer through the gate insulating layer;
    a source electrode in contact with the oxide semiconductor layer;
    a drain electrode in contact with the oxide semiconductor layer; and
    n (n is a natural number) metal layer(s) in contact with the oxide semiconductor layer and disposed across the oxide semiconductor layer between the source electrode and the drain electrode, wherein
    the oxide semiconductor layer has n low resistance region(s) at region(s) where the n metal layer(s) overlap(s),
    the oxide semiconductor layer has (n+1) channel regions between the source electrode and the drain electrode in a plan view, and
    an oxygen concentration of the low resistance region is lower than an oxygen concentration of the channel region.

2. The semiconductor device according to claim 1, wherein
    when n is 1, the oxide semiconductor layer has a first channel region between the source electrode and a metal layer and a second channel region between the drain electrode and the metal layer in a plan view.

3. The semiconductor device according to claim 1, wherein
    when n is 2, the oxide semiconductor layer has a first channel region between the source electrode and a first metal layer, a second channel region between the drain electrode and a second metal layer and a third channel region between the first metal layer and the second metal layer in a plan view.

4. The semiconductor device according to claim 1, wherein
    the n metal layer(s) is/are located in the same layer as the source electrode and the drain electrode.

5. The semiconductor device according to claim 1, wherein
    the n metal layer(s) is/are formed of the same metal material as the source electrode and the drain electrode.

6. The semiconductor device according to claim 1, wherein
    the n metal layer(s) is/are electrically floating.

7. The semiconductor device according to claim 1, wherein
    the (n+1) channel regions are separated respectively by a separating region in contact with the n metal layer(s).

8. The semiconductor device according to claim 1, wherein
    the material of the n metal layer(s) include(s) titanium or molybdenum.

* * * * *